United States Patent
Noda

(10) Patent No.: US 9,651,876 B2
(45) Date of Patent: May 16, 2017

(54) MEASUREMENT APPARATUS, LITHOGRAPHY APPARATUS, AND ARTICLE MANUFACTURING METHOD

(71) Applicant: CANON KABUSHIKI KAISHA, Tokyo (JP)

(72) Inventor: Kenji Noda, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 49 days.

(21) Appl. No.: 14/718,506

(22) Filed: May 21, 2015

(65) Prior Publication Data

US 2015/0346611 A1 Dec. 3, 2015

(30) Foreign Application Priority Data

May 27, 2014 (JP) ................. 2014-109429

(51) Int. Cl.
*G03B 27/62* (2006.01)
*G03F 7/20* (2006.01)
*G01B 11/00* (2006.01)

(52) U.S. Cl.
CPC ........ *G03F 7/70775* (2013.01); *G01B 11/002* (2013.01); *G03F 7/70725* (2013.01)

(58) Field of Classification Search
CPC .. G03F 7/70725; G03F 7/70775; G03F 7/709; G01B 11/002

USPC ............................................ 355/75
See application file for complete search history.

(56) References Cited

U.S. PATENT DOCUMENTS

2002/0001082 A1* 1/2002 Akimoto ............. G03F 7/70241
356/400
2002/0044269 A1* 4/2002 Yonekawa .......... G03F 7/70691
355/53

FOREIGN PATENT DOCUMENTS

JP 3548428 B2 7/2004

* cited by examiner

*Primary Examiner* — Peter B Kim
(74) *Attorney, Agent, or Firm* — Rossi, Kimms & McDowell LLP

(57) ABSTRACT

A measurement apparatus includes: an imaging unit positioned with fixing with respect to a first member; a first detector configured to detect a position of a stage with reference to a second member; a second detector configured to detect fluctuation of a position of the first member with reference to the second member; and a control unit configured to obtain the position of the mark from an image of the mark sensed by the imaging unit while controlling a relative position of the stage relative to the second member so as to reduce fluctuation of a relative position of the mark relative to the imaging unit due to the fluctuation of the position of the first member based on detection results of the first and second detectors.

18 Claims, 5 Drawing Sheets

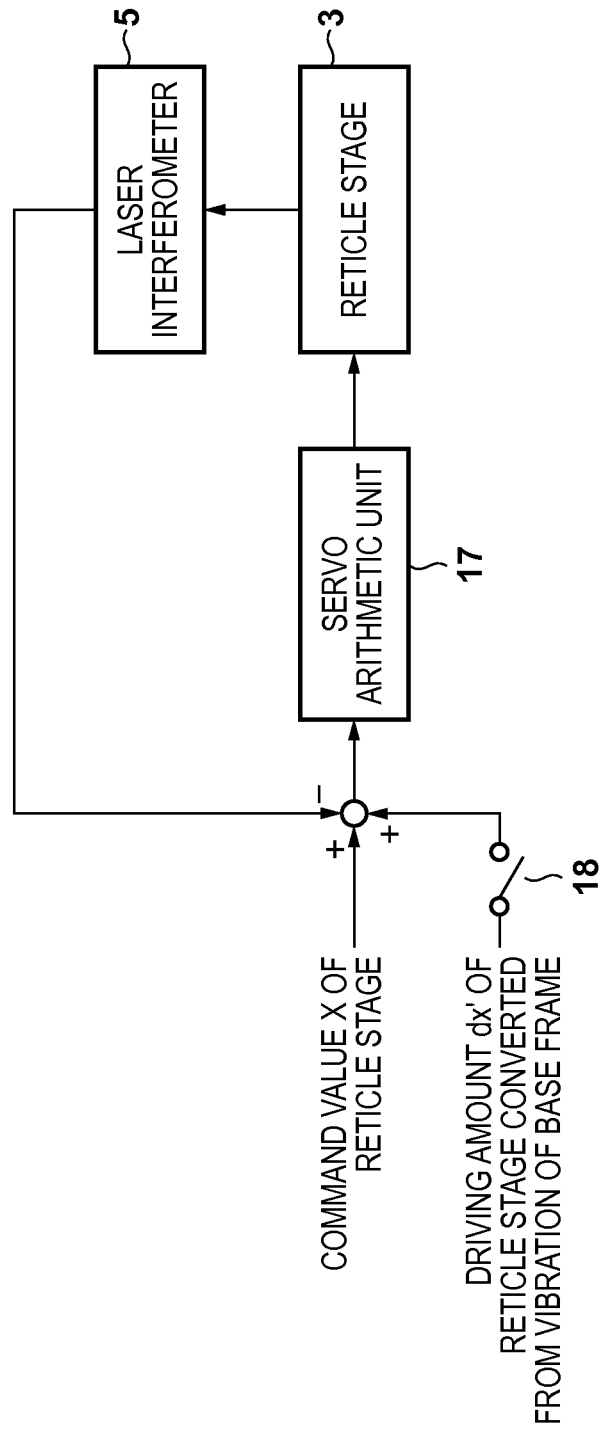

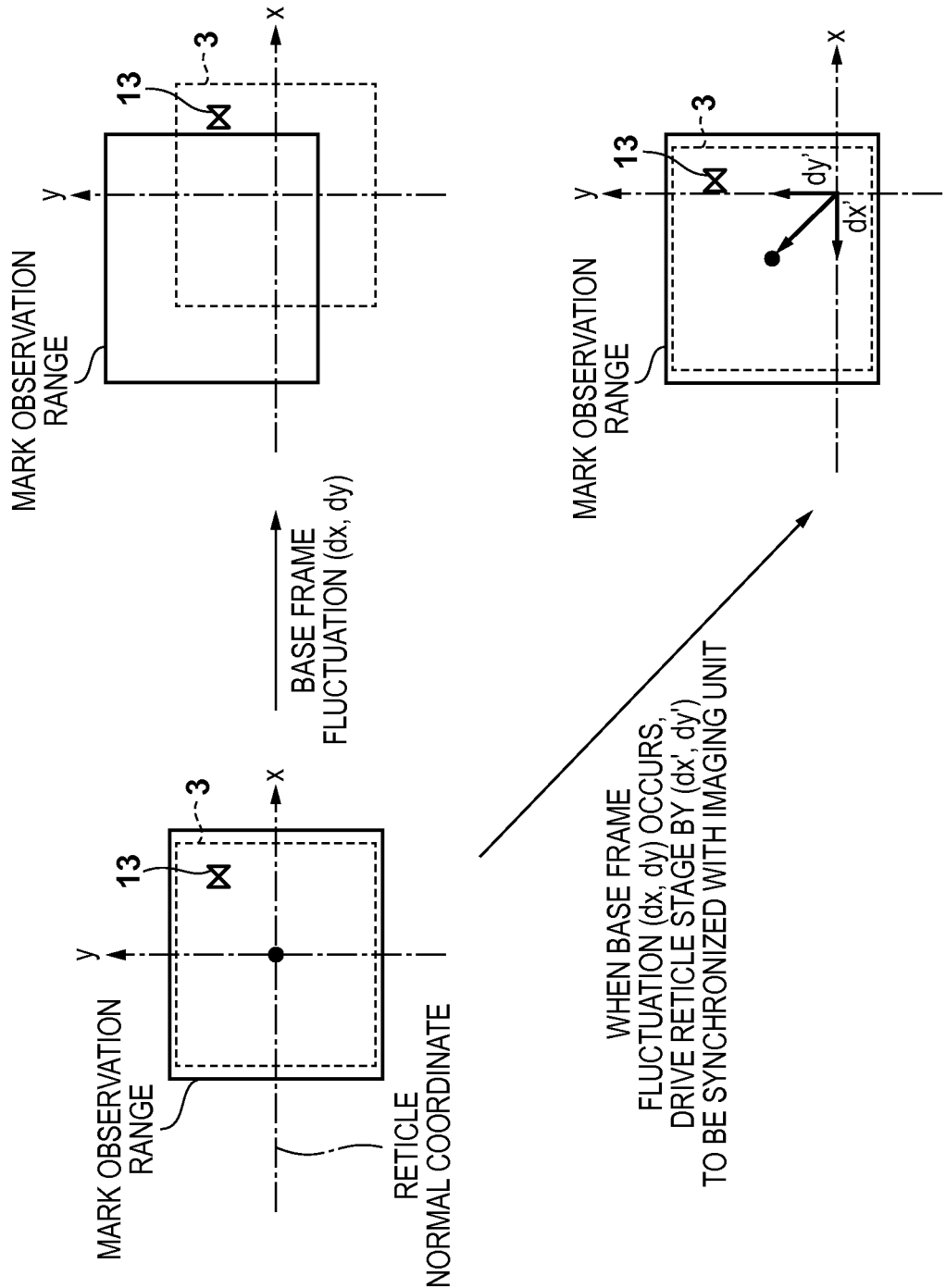

MEASUREMENT APPARATUS, LITHOGRAPHY APPARATUS, AND ARTICLE MANUFACTURING METHOD

BACKGROUND OF THE INVENTION

Field of the Invention

The present invention relates to a measurement apparatus, a lithography apparatus, and an article manufacturing method.

Description of the Related Art

Recently, exposure apparatuses have undergone progress of refinement of exposure accuracy, and have been strictly required for accuracy in positioning at the same time. In measurement for positioning, an image of a mark placed on a reticle that is an original is fetched by a measurement device for a mark position, such as a CCD camera, and the mark position is measured by processing the fetched image signals with a measurement apparatus. Hence, it is optimum to keep the measurement device for measuring the mark position and the mark in a state free from minute fluctuation due to vibrations or the like during performing the measurement for the positioning.

If the stage where the mark is placed and the measurement device for the mark position are not supported by an identical housing, it is difficult to eliminate relative fluctuation between the stage and the measurement device due to vibrations of a floor. Consequently, the relative fluctuation between the stage and the measurement device during a time period of fetching the image signals causes deterioration of the measurement accuracy.

As one solution for such problems, Japanese Patent No. 3548428 discloses a method of finding an average position of the mark during a time period of fetching image signals, for example. An apparatus described in Japanese Patent No. 3548428 includes a measurement device to measure a position of the stage several times, and averages positional data measured several times, thereby enhancing measurement accuracy.

The positional measurement apparatus disclosed in Japanese Patent No. 3548428 finds an average position of the mark based on the accumulated image signals. In the case of having a shorter relative fluctuation period between the stage and the measurement device than a time period of fetching the image, a fluctuation component between the stage and the measurement device can be offset by finding the average position of the mark, thereby enhancing the measurement accuracy of the mark position. To the contrary, in the case of having a longer relative fluctuation period between the stage and the measurement device than the time period of fetching the image, a fluctuation component between the stage and the measurement device cannot be offset even if the average position of the mark is found; thus the measurement accuracy of the mark position is not enhanced. It may be considered to increase a frequency of the measurement of the stage position in accordance with the relative fluctuation period between the stage and the measurement device, which makes the measurement time period longer, resulting in deterioration of productivity in the apparatus.

SUMMARY OF THE INVENTION

The present invention provides a measurement apparatus having advantages in measurement accuracy and measurement time period. The present invention provides a measurement apparatus for measuring a position of a mark on a stage, the apparatus comprising: an imaging unit positioned with fixing with respect to a first member and configured to sense an image of the mark; a first detector configured to detect a position of the stage with reference to a second member; a second detector configured to detect fluctuation of a position of the first member with reference to the second member; and a control unit configured to obtain the position of the mark from an image of the mark by the imaging unit while controlling a relative position of the stage relative to the second member so as to reduce fluctuation of a relative position of the mark relative to the imaging unit due to the fluctuation of the position of the first member based on a detection result of the first detector and a detection result of the second detector.

Further features of the present invention will become apparent from the following description of exemplary embodiments with reference to the attached drawings.

BRIEF DESCRIPTION OF THE DRAWINGS

FIG. 4 is a schematic configuration view of a position control system; and

FIG. 5 is a drawing showing images of the mark when performing control of the present embodiment.

DESCRIPTION OF THE EMBODIMENTS

[Exposure Apparatus]

Figure 1:
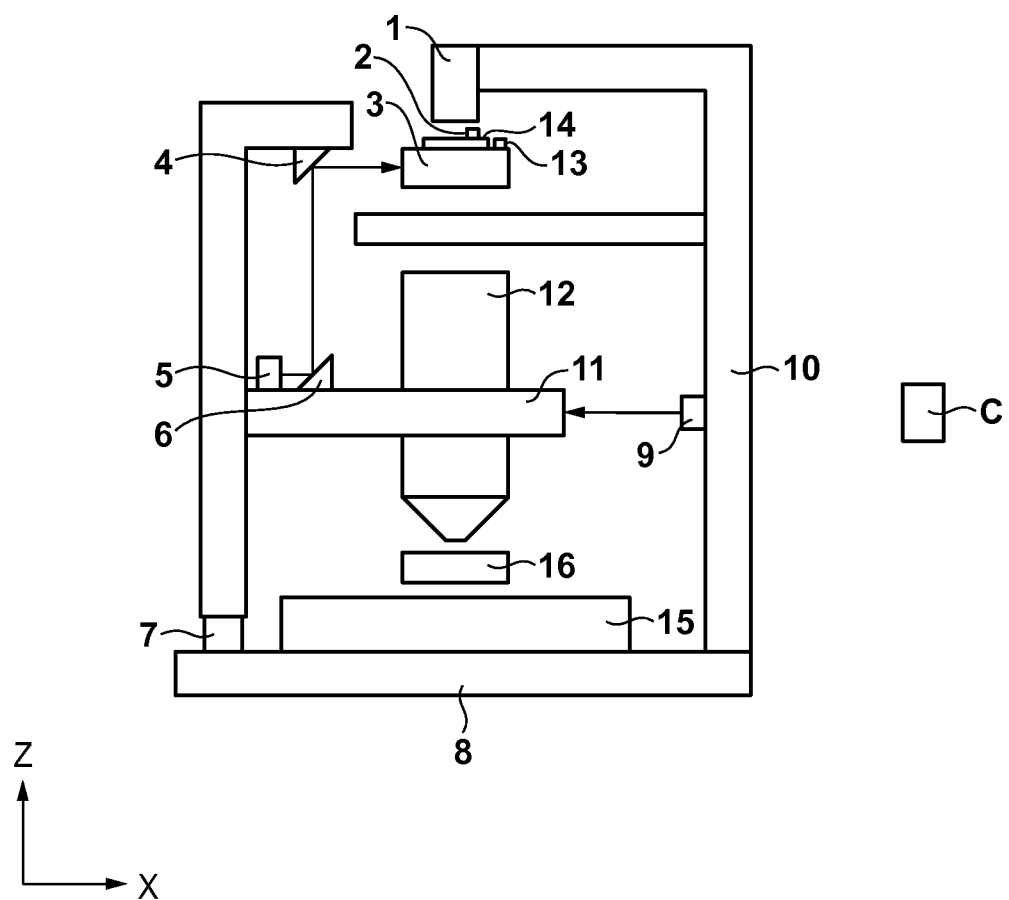
FIG. 1 is a schematic view showing a configuration of an exposure apparatus.
Figure 2:
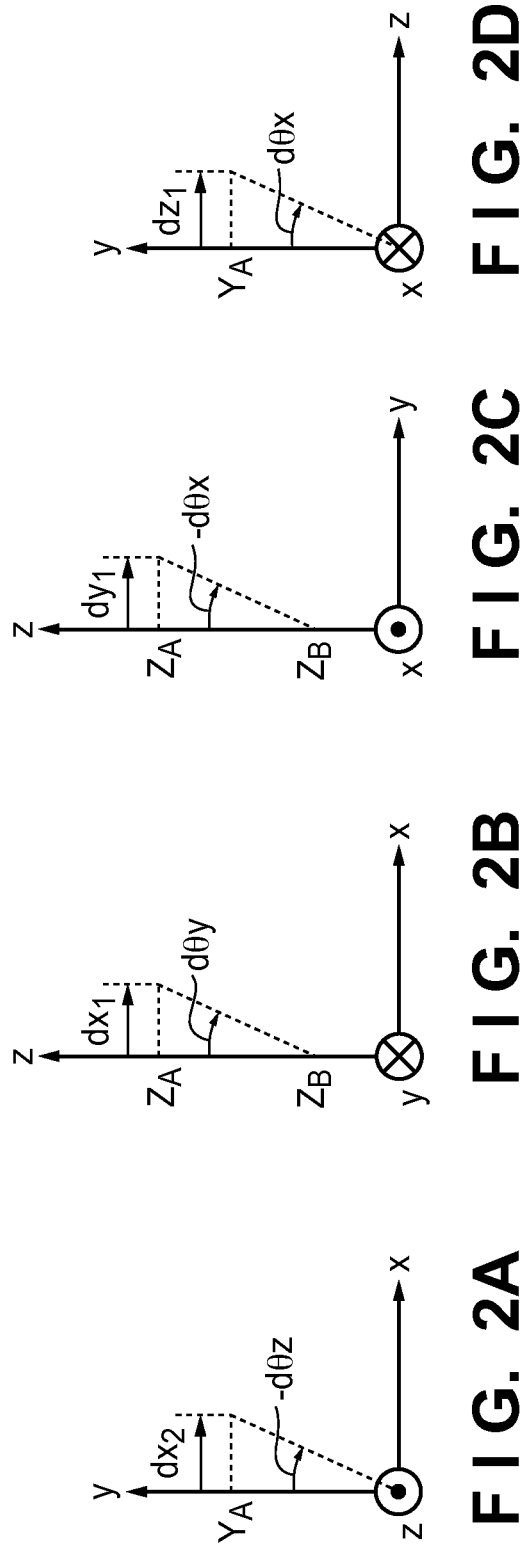
FIGS. 2A to 2D are drawings showing a positional relation between an optical system support and a reticle stage.

FIG. 1 is a schematic plan view of an exposure apparatus according to the present embodiment. In FIG. 1, a CCD camera (imaging unit) 1 senses an image of a mark 13 placed on a reticle stage (original stage) 3, or an image of a mark 2 placed on an object (reticle, original) 14. The imaging unit 1 is fixed to and positioned with respect to a base frame 10 (first member). A projection optical system 12 is supported by an optical system support (second member) 11. An active mount 7 supports the optical system support 11 while suppressing vibrations of the optical system support 11, and also isolates vibrations from the floor. A base 8 supports the active mount 7. Fixed mirrors 4, 6 are fixed to the optical system support 11 to be used for measuring a position of the reticle stage 3. A laser interferometer (first detector) 5 is fixed to the optical system support 11 to detect a position X of the reticle stage 3 with reference to the optical system support 11. Similarly, a laser interferometer (not shown) for measuring a position Y of the reticle stage 3 is fixed to the optical system support 11. The reticle stage 3 is so supported by the base frame 10 as to be positionable with respect to six axes.

A displacement meter (second detector) 9 is fixed to the base frame 10, and measures a fluctuation X in an X direction of the position of the optical system support 11 with reference to the base frame 10. The fluctuation X has a value equal to that of a fluctuation of the position of the base frame 10 with reference to the optical system support 11. Similarly, a displacement meter (not shown) for measuring fluctuations in Y, Z directions of the position of the optical system support 11 is fixed to the base frame 10. A controller (control unit) C calculates inclinations θX, θY, θZ with an X axis, Y axis, Z axis as centers based on fluctuations X, Y, Z in the X, Y, Z directions. A stage base 15 supports a wafer stage (substrate stage) 16. The wafer stage 16 controls the position of a not-shown wafer (substrate).

FIGS. 2A to 2D show a positional relation between the position of the optical system support 11 and the reticle stage 3 when the base frame 10 vibrates by (dx, dy, dz, dθx, dθy, dθz). For example, the center position of the projection optical system 12 is defined as (X,Y,Z)=(0,0,0). The position of the optical system support 11 is defined as (X,Y,Z)=(0,0,ZB). The position of the reticle stage 3 at the time of measuring the mark 13 by the imaging unit 1, for example, is defined as (X,Y,Z)=(0,YA,ZA). FIGS. 2A to 2D show respective positional fluctuations dx2, dx1, dy1, dz1 of the reticle stage 3 observed from the imaging unit 1 when the base frame 10 is changed by −dθz, dθy, −dθx, dθx, respectively. Accordingly, the positional fluctuation (dx', dy', dz', dθx', dθy', dθz') of the reticle stage 3 observed from the imaging unit 1 can be represented by Formula 1. Note that dx1, dx2, dy1, dz1 can be represented by Formula 2. Accordingly, the positional fluctuation (dx', dy', dz', dθx', dθy', dθz') of the reticle stage 3 when the base frame 10 vibrates by (dx, dy, dz, dθx, dθy, dθz) can be represented by Formula 3.

$$\begin{bmatrix} dx' \\ dy' \\ dz' \\ d\theta x' \\ d\theta y' \\ d\theta z' \end{bmatrix} = \begin{bmatrix} dx + dx_1 - dx_2 \\ dy - dy_1 \\ dz + dz_1 \\ d\theta x \\ d\theta y \\ d\theta z \end{bmatrix} \quad (1)$$

$$dx_1 = (Z_A - Z_B)\tan(d\theta y) \approx (Z_A - Z_B)d\theta y \quad (2)$$
$$dx_2 = Y_A \tan(d\theta z) \approx Y_A d\theta z$$
$$dy_1 = (Z_A - Z_B)\tan(d\theta x) \approx (Z_A - Z_B)d\theta x$$
$$dz_1 = Y_A \tan(d\theta x) \approx Y_A d\theta x$$

$$\begin{bmatrix} dx' \\ dy' \\ dz' \\ d\theta x' \\ d\theta y' \\ d\theta z' \end{bmatrix} = \begin{bmatrix} 1 & 0 & 0 & 0 & (Z_A - Z_B) & -Y_A \\ 0 & 1 & 0 & -(Z_A - Z_B) & 0 & 0 \\ 0 & 0 & 1 & Y_A & 0 & 0 \\ 0 & 0 & 0 & 1 & 0 & 0 \\ 0 & 0 & 0 & 0 & 1 & 0 \\ 0 & 0 & 0 & 0 & 0 & 1 \end{bmatrix} \begin{bmatrix} dx \\ dy \\ dz \\ d\theta x \\ d\theta y \\ d\theta z \end{bmatrix} \quad (3)$$

By driving the reticle stage 3 by (dx', dy', dz', dθx', dθy', dθz'), the reticle stage 3 seems to stay still if viewed from the base frame 10. Hence, the reticle stage 3 and the mark 13 on the reticle stage 3 seem to stay still viewed from the imaging unit 1 even if the base frame 10 vibrates.

Figure 3:
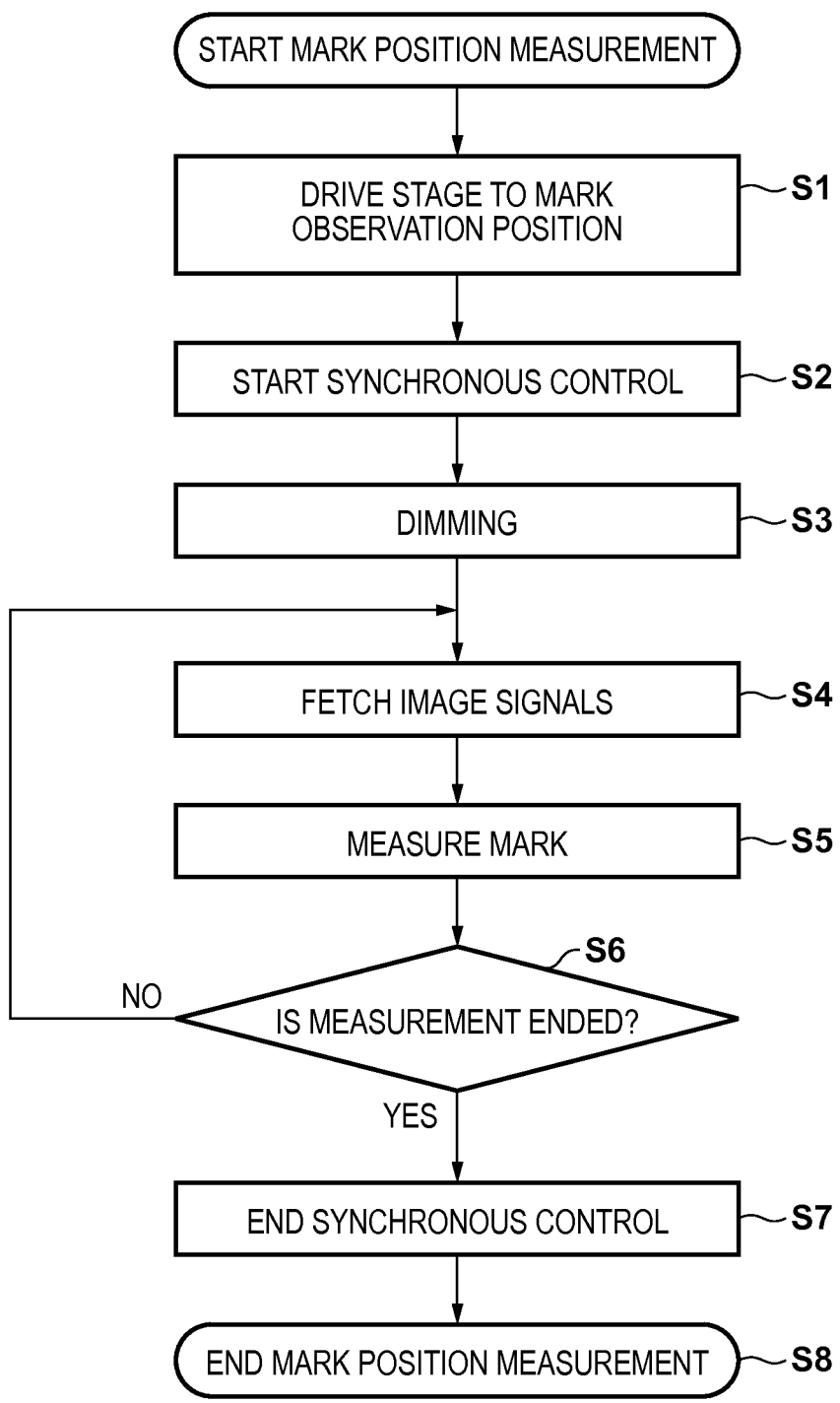
FIG. 3 is a flow chart showing one example of a measurement sequence of a mark position.

A measurement method of the mark position according to the present embodiment will be described, hereinafter. FIG. 3 is a flow chart showing one example of a measurement sequence of the mark position in the exposure apparatus of FIG. 1. First, in S1, the controller C drives the reticle stage 3 in a manner as to locate the position of the mark 13 within an observation range of the imaging unit 1. When moving of the mark to the observation position is ended in S1, the controller C starts synchronous control between the reticle stage 3 and the imaging unit 1, that is, control to reduce fluctuation of the relative position of the mark 13 relative to the base frame 10 in S2. The synchronous control will be described later with reference to FIG. 4.

In S3, the controller C performs dimming for observing the mark 13 by irradiating the mark 13 with a non-exposure light from a light source of the imaging unit 1. In S4, the controller C fetches image signals of the mark 13 on the reticle stage 3, which is irradiated with the non-exposure light from the imaging unit 1. In S5, the controller C obtains the position of the mark 13 based on the fetched image signals. If the measurement is ended in S6, the controller C ends the synchronous control in S7.

FIG. 4 is a schematic explanatory view of the synchronous control on the reticle stage 3 by the controller C. In response to a given command value X of a target position of the reticle stage 3, a servo arithmetic unit 17 in the controller C performs PID control or the like to correct data on the position of the reticle stage 3, for example. The displacement of the reticle stage 3 controlled through the above correction is detected by the laser interferometer 5, and a difference between the command value and the detected result of the laser interferometer 5 is fed back to the servo arithmetic unit 17. When the synchronization between the reticle stage 3 and the imaging unit 1 is started in S2, a switch 18 is turned on to add a driving amount dx' of the reticle stage converted from the vibration of the optical system support 11 to the command value X of the reticle stage. The same control is performed on command values Y, Z, θx, θy, θz of the reticle stage 3 (not shown). When the synchronization between the reticle stage 3 and the imaging unit 1 is started, the reticle stage 3 is driven in synchronization with a vibration in the X direction, Y direction, Z direction, θX direction, θY direction, or θZ direction of the base frame 10. During the synchronization, the position of the base frame 10 with reference to the optical system support 11 is measured by the displacement meter 9. The detected result of the base frame 10 at this time is (dx, dy, dz, dθx, dθy, dθz). The imaging unit 1 fixed to the base frame 10 vibrates in accordance with the vibration of the base frame 10. Then, the synchronous control between the reticle stage 3 and the imaging unit 1 is carried out by using the driving amount (dx', dy', dz', dθx', dθy', dθz') of the reticle stage 3, which is found by using Formula 3.

Subsequent to the end of the measurement of the mark 13, when the synchronous control between the reticle stage 3 and the imaging unit 1 is ended (S7), the switch 18 is turned off in S8.

A method of observing the mark 13 that is a positioning mark by the imaging unit 1 will be described with reference to FIG. 5. First, the mark 13 is observed at a position shown in FIG. 5. Thereafter, it is assumed that the base frame 10 is fluctuated during the measurement. It is assumed that the fluctuation amount is (dx, dy), for example. In this case, if the reticle stage 3 and the imaging unit 1 are out of synchronization, the mark measurement range of the imaging unit 1 deviates relative to the mark 13 as shown in FIG. 5.

To the contrary, if the reticle stage 3 and the imaging unit 1 are synchronized, the relative position between the mark 13 and the mark observation range becomes constant without having change in position as shown in FIG. 5. Accordingly, it is possible to prevent deterioration of positioning accuracy due to the relative fluctuation between the reticle stage 3 and the imaging unit 1, thereby attaining position measurement with high accuracy.

In the present embodiment, the case of detecting the position of the mark 13 placed on the reticle stage 3 by using the imaging unit 1 has been described. However, the present invention is also applicable to such a case that detects the mark 2 placed on the reticle 14 by using the imaging unit 1. The present invention is also applicable to such a case that measures the position of a mark placed on the wafer stage 16, or the position of a mark placed on a wafer held by the wafer stage 16 by using the imaging unit 1 installed to the base frame 10.

In the present embodiment, the measurement apparatus for measuring the position of the mark 13 is installed to the exposure apparatus. However, the measurement apparatus according to the present invention is also applicable to other lithography apparatuses, such as an imprint apparatus for forming a pattern on a substrate by bringing an original into contact with the substrate.

[Article Manufacturing Method]

An article manufacturing method as one aspect of the present invention is suitable for manufacturing of an article, such as a micro device like a semiconductor device, and an element having a microstructure. The article manufacturing method of the present embodiment includes a step of transferring a pattern (latent image pattern) on a resist applied on a substrate by using an exposure apparatus or a charged particle beam lithography apparatus, and a step of developing (processing) the substrate on which the latent image pattern is transferred in the above preceding step. This manufacturing method may further include other well-known steps (such as oxidization, film formation, vaporization, doping, flattening, etching, resist stripping, dicing, bonding, and packaging). The article manufacturing method of the present embodiment has an advantage in at least one of performance, quality, productivity, and production cost of the article, compared with conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-109429, filed May 27, 2014, which is hereby incorporated by reference herein in its entirety.

What is claimed is:

1. A measurement apparatus for measuring a position of a mark on a stage, the apparatus comprising:
   an imaging unit fixed to a first member and configured to sense an image of the mark;
   a first detector configured to detect a position of said stage with reference to a second member;
   a second detector configured to detect fluctuation of a position of said first member with reference to said second member; and
   a control unit configured to obtain the position of the mark based on an image of the mark sensed by said imaging unit while controlling a relative position of said stage relative to said second member so as to reduce fluctuation of a relative position of the mark relative to said imaging unit due to the fluctuation of the position of said first member based on a detection result of said first detector and a detection result of said second detector.

2. The apparatus according to claim 1, wherein said control unit corrects data on the position of said stage detected by said first detector by using the detection result of said second detector, and senses the image of the mark by said imaging unit while controlling the position of said stage based on the corrected data.

3. The apparatus according to claim 2, wherein said stage is positionable with respect to six axes, and said control unit corrects the data on the position of said stage detected by said first detector with respect to at least one of the six axes.

4. The apparatus according to claim 1, wherein said control unit corrects a target position of said stage by using the detection result of said first detector and the detection result of said second detector, and senses the image of the mark by said imaging unit while controlling the position of said stage to be the corrected target position.

5. The apparatus according to claim 4, wherein said stage is positionable with respect to six axes, and said control unit corrects the target position of said stage with respect to at least one of the six axes.

6. The measurement apparatus according to claim 1, wherein said first member supports said stage.

7. The apparatus according to claim 1, wherein the mark is formed on an object placed on said stage.

8. The apparatus according to claim 1, wherein said second detector is held by said first member or said second member.

9. The apparatus according to claim 1, wherein each of said first detector and said second detector includes a displacement meter.

10. The apparatus according to claim 9, wherein said first detector includes an interferometer.

11. A lithography apparatus for forming a pattern on a substrate, the apparatus comprising:
    an original stage configured to hold an original;
    a substrate stage configured to hold said substrate;
    a first member;
    a second member; and
    a measurement apparatus for measuring a position of a mark on at least one stage of said original stage and said substrate stage,
    wherein said measurement apparatus includes:
    an imaging unit fixed to said first member and configured to sense an image of the mark;
    a first detector configured to detect a position of said stage with reference to said second member;
    a second detector configured to detect fluctuation of a position of said first member with reference to said second member; and
    a control unit configured to obtain the position of the mark based on an image of the mark sensed by said imaging unit while controlling a relative position of said stage relative to said second member so as to reduce fluctuation of a relative position of the mark relative to said imaging unit due to the fluctuation of the position of said first member based on a detection result of said first detector and a detection result of said second detector.

12. The lithography apparatus according to claim 11, wherein said apparatus includes an exposure apparatus for projecting a pattern of said original to said substrate via a projection optical system to form a pattern on said substrate.

13. The apparatus according to claim 12, wherein said second member includes a support of an optical system barrel for holding said projection optical system.

14. The apparatus according to claim 11, wherein said apparatus includes an imprint apparatus for forming a pattern on said substrate by bringing said original into contact with said substrate.

15. The apparatus according to claim 11, wherein said first member and said second member are separated from each other.

16. The apparatus according to claim 11, wherein said second member is supported through a vibration isolator.

17. The apparatus according to claim 11, wherein said stage is supported by said first member.

18. A method of manufacturing an article, the method comprising:
   forming a pattern on a substrate by using a lithography apparatus; and
   processing said substrate on which the pattern has been formed to manufacture the article,
   wherein said lithography apparatus includes:
   an original stage configured to hold an original;
   a substrate stage configured to hold said substrate;
   a first member;
   a second member; and
   a measurement apparatus for measuring a position of a mark on at least one stage of said original stage and said substrate stage,
   wherein said measurement apparatus includes:
   an imaging unit fixed to said first member and configured to sense an image of the mark;
   a first detector configured to detect a position of said stage with reference to said second member;
   a second detector configure to detect fluctuation of a position of said first member with reference to said second member; and
   a control unit configured to obtain the position of the mark based on an image of the mark sensed by said imaging unit while controlling a relative position of said stage relative to said second member so as to reduce fluctuation of a relative position of the mark relative to said imaging unit due to the fluctuation of the position of said first member based on a detection result of said first detector and a detection result of said second detector.

* * * * *